United States Patent
Moon et al.

(10) Patent No.: US 11,891,688 B2
(45) Date of Patent: Feb. 6, 2024

(54) MASK AND DEPOSITION APPARATUS INCLUDING THE SAME

(71) Applicant: Samsung Display Co., Ltd., Yongin-si (KR)

(72) Inventors: Youngmin Moon, Yongin-si (KR); Jeongkuk Kim, Suwon-si (KR); Minho Moon, Seongnam-si (KR); Ji-Hee Son, Hwaseong-si (KR); Seungyong Song, Suwon-si (KR); Areum Lee, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/748,596

(22) Filed: May 19, 2022

(65) Prior Publication Data
US 2023/0022195 A1 Jan. 26, 2023

(30) Foreign Application Priority Data
Jul. 26, 2021 (KR) .......... 10-2021-0097622

(51) Int. Cl.
*C23C 16/04* (2006.01)

(52) U.S. Cl.
CPC .......... *C23C 16/042* (2013.01); *C23C 16/045* (2013.01)

(58) Field of Classification Search
None
See application file for complete search history.

(56) References Cited

U.S. PATENT DOCUMENTS

| 2005/0226492 | A1 | 10/2005 | Ho |
| 2016/0145762 | A1* | 5/2016 | Im .......... C25D 1/10 |
| | | | 205/70 |
| 2017/0250381 | A1 | 8/2017 | Okawara |

FOREIGN PATENT DOCUMENTS

| KR | 10-2008-0089757 | 10/2008 | |
| KR | 10-2000548 | 7/2019 | |
| KR | 10-2021-0003969 | 1/2021 | |
| WO | 2015172834 | 11/2015 | |
| WO | WO-2015172834 A1 * | 11/2015 | .......... C23C 14/042 |
| WO | 2020190444 | 9/2020 | |

OTHER PUBLICATIONS

Extended European search report for European Patent Application or Patent No. 22186997.7 dated Dec. 23, 2022.

* cited by examiner

*Primary Examiner* — Alexander M Weddle
(74) *Attorney, Agent, or Firm* — KILE PARK REED & HOUTTEMAN PLLC

(57) ABSTRACT

A mask includes a protruding portion provided with a deposition hole formed therethrough and including an upper surface, a lower surface facing the upper surface, and a side surface disposed between the upper surface and the lower surface and inclined at an angle with respect to the lower surface, a peripheral portion including a first surface extending from the upper surface, a second surface facing the first surface and having a step difference with respect to the lower surface of the protruding portion, and a coating layer disposed on the protruding portion. The protruding portion includes at least one of a protrusion protruded from the side surface of the protruding portion and a groove formed by removing at least a portion of the protruding portion from the side surface of the protruding portion, and the coating layer covers at least one of the protrusion and the groove.

20 Claims, 12 Drawing Sheets

MASK AND DEPOSITION APPARATUS INCLUDING THE SAME

CROSS-REFERENCE TO RELATED APPLICATION(S)

This U.S. application claims priority to and the benefit of Korean Patent Application No. 10-2021-0097622 under 35 U.S.C. § 119, filed in the Korean Intellectual Property Office (KIPO) on Jul. 26, 2021, the entire content of which is incorporated herein by reference.

BACKGROUND

1. Technical Field

The disclosure relates to a mask and a deposition apparatus including the same. More particularly, the disclosure relates to a mask with improved deposition precision and deposition reliability and a deposition apparatus including the mask.

2. Description of the Related Art

A deposition apparatus is used to deposit a thin layer when a display device is manufactured. The deposition apparatus heats a deposition material in a chamber with high vacuum to evaporate the deposition material, and thus, the evaporated deposition material is condensed on a surface of a substrate to form the thin layer.

Functional layers of a display element are formed through a patterning process using a mask provided with a deposition hole defined or formed therethrough. For example, the deposition hole may penetrate the mask. In this case, the patterned functional layers have a shape determined depending on a shape of the deposition hole. Accordingly, a mask including deposition hole with improved precision is required to improve a deposition quality of the patterned functional layers.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure may provide a mask in which deposition precision and deposition reliability may be improved.

The disclosure may provide a deposition apparatus including the mask.

According to one or more embodiments, a mask may be provided with a deposition hole formed therethrough and include a protruding portion including an upper surface, a lower surface facing the upper surface, and a side surface disposed between the upper surface and the lower surface and inclined at an angle with respect to the lower surface, a peripheral portion including a first surface extending from the upper surface of the protruding portion, and a second surface facing the first surface and having a step difference with respect to the lower surface of the protruding portion, and a coating layer disposed on the protruding portion. The protruding portion may include at least one of a protrusion protruded from the side surface of the protruding portion, and a groove formed by removing at least a portion of the protruding portion from the side surface of the protruding portion, and the coating layer covers at least one of the protrusion and the groove.

The coating layer may be disposed in an area where a thickness between the lower surface and the side surface of the protruding portion is equal to or smaller than about 30 micrometers in case that the protruding portion includes the groove.

The coating layer may be disposed on the side surface of the protruding portion and has a thickness equal to or smaller than about 5 micrometers.

The groove may penetrate the protruding portion from the side surface of the protruding portion to the lower surface of the protruding portion, and the coating layer is disposed on the lower surface of the protruding portion.

A thickness between the first surface and the second surface of the peripheral portion may be greater than a thickness between the upper surface and the lower surface of the protruding portion, and the coating layer may have a thickness about 5 micrometers smaller than a difference in thickness between the peripheral portion and the protruding portion.

The difference in thickness between the peripheral portion and the protruding portion may be equal to or smaller than about 30 micrometers.

The coating layer may be disposed on the side surface of the protruding portion in case that the protruding portion includes the protrusion.

The coating layer may have a thickness equal to or smaller than about 20 micrometers.

The coating layer may have a thermal expansion coefficient equal to or smaller than about 3 ppm/° C.

The coating layer may include polyimide.

The protruding portion and the peripheral portion may include at least an alloy of iron (Fe) and nickel (Ni).

The groove may be provided in plural such that the mask includes a plurality of grooves, the coating layer may be provided in plural such that the mask includes a plurality of coating layers, and the plurality of coating layers may correspond to the plurality of grooves, respectively, and may be disposed spaced apart from each other.

The coating layer may surround at least a portion of the side surface of the protruding portion or at least a portion of the lower surface of the protruding portion.

Embodiments of the disclosure may provide a deposition apparatus. The deposition apparatus may include a chamber accommodating a base substrate, a deposition source spraying a deposition material to the base substrate, a mask including a first protruding portion including a first deposition hole, a second protruding portion including a second deposition hole spaced apart from the first deposition hole, and a peripheral portion surrounding the first protruding portion and the second protruding portion, and including a first surface facing the deposition source, and a second surface facing the first surface and contacting the base substrate, and a coating layer disposed on the mask. Each of the first protruding portion and the second protruding portion may include a lower surface, an upper surface extending from the first surface of the peripheral portion, and a side surface disposed between the upper surface and the lower surface and inclined at an angle with respect to the lower surface. The second protruding portion may include a protrusion protruded from the side surface of the second protruding portion, and a groove formed by removing at least a portion of the second protruding portion, and the coating layer covers at least one of the protrusion and the groove.

The coating layer may have a thermal expansion coefficient equal to or smaller than about 3 ppm/° C.

The coating layer may be disposed in an area where a thickness between the lower surface and the side surface is equal to or smaller than about 30 micrometers in case that the protruding portion includes the groove.

The coating layer may be disposed on the side surface of the second protruding portion and has a thickness equal to or smaller than about 5 micrometers.

The groove may penetrate the second protruding portion from the side surface of the second protruding portion to the lower surface of the second protruding portion, and the coating layer may be disposed on the lower surface of the second protruding portion and spaced apart from the base substrate by about 5 micrometers or more.

An end surface of the coating layer adjacent to the second deposition hole may be aligned with a boundary between the side surface of the second protruding portion and the lower surface of the second protruding portion.

The coating layer may be disposed on the side surface of the second protruding portion and may have a thickness equal to or smaller than about 20 micrometers in case that the second protruding portion includes the protrusion.

According to the above, the coating layer may be disposed to cover the defects formed in the mask, such as the groove and the protrusion, and thus, deposition defects caused by the defects generated during a manufacturing process of the mask may be prevented. Thus, deposition precision and deposition reliability may be improved.

BRIEF DESCRIPTION OF THE DRAWINGS

The above and other advantages of the disclosure will become readily apparent by reference to the following detailed description when considered in conjunction with the accompanying drawings wherein.

DETAILED DESCRIPTION OF THE EMBODIMENTS

Figure 1:
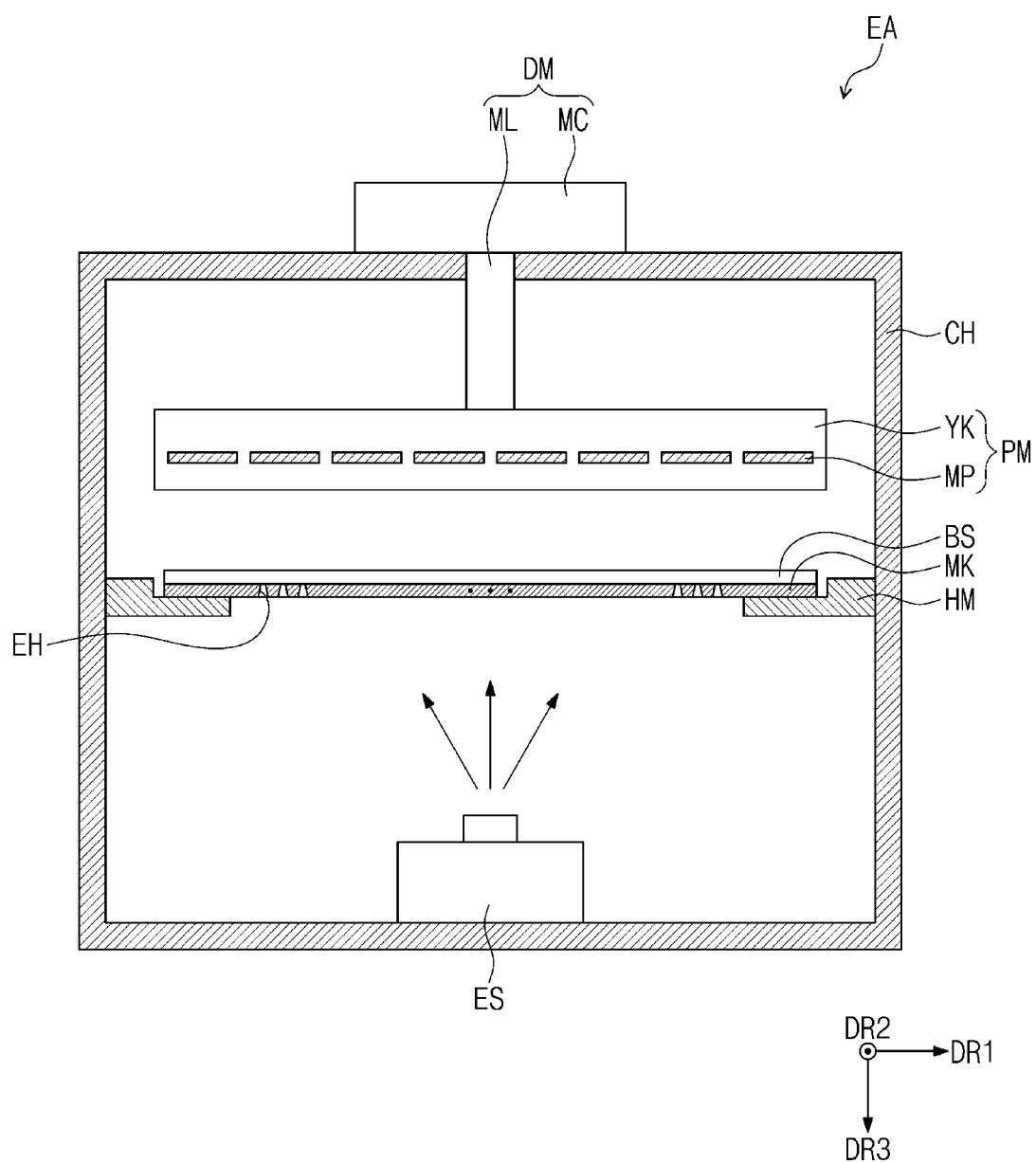
FIG. 1 is a schematic cross-sectional view showing a deposition apparatus according to an embodiment of the disclosure.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

Some of the parts which are not associated with the description may not be provided in order to describe embodiments of the disclosure and like reference numerals refer to like elements throughout the specification.

In the disclosure, it will be understood that when an element or layer is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms "first," "second," etc. may be used herein to describe various elements, these elements should not be limited by these terms. These terms are only used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

It will be further understood that the terms "comprises," "comprising," "have" "having" "includes" and/or "including", when used in this specification, specify the presence of stated features, integers, steps, operations, elements, and/or components, but do not preclude the presence or addition of one or more other features, integers, steps, operations, elements, components, and/or groups thereof. Hereinafter, the disclosure will be explained in detail with reference to the accompanying drawings.

When a layer, film, region, substrate, or area, or element is referred to as being "on" another layer, film, region, substrate, or area, or element, it may be directly on the other film, region, substrate, or area, or element, or intervening films, regions, substrates, or areas, or elements may be present therebetween. Conversely, when a layer, film, region, substrate, or area, or element, is referred to as being "directly on" another layer, film, region, substrate, or area, or element, intervening layers, films, regions, substrates, or areas, may be absent therebetween. Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Further, in the specification, the phrase "in a plan view" means when an object portion is viewed from above, and the phrase "in a schematic cross-sectional view" means when a schematic cross-section taken by vertically cutting an object portion is viewed from the side.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

When an embodiment may be implemented differently, a specific process order may be performed differently from the described order. For example, two consecutively described processes may be performed substantially at the same time or performed in an order opposite to the described order.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that when a layer, region, or element is referred to as being "connected to" or "coupled to" another layer, region, or element, it can be directly connected or coupled to the other layer, region, or element or intervening layers, regions, or elements may be present. For example, as used herein, when a layer, region, or element is referred to as being "electrically connected to" another layer, region, or element, it can be directly electrically connected to the other layer, region, or element or intervening layers, intervening regions, or intervening elements may be present.

Also, when an element is referred to as being "in contact" or "contacted" or the like to another element, the element may be in "electrical contact" or in "physical contact" with another element; or in "indirect contact" or in "direct contact" with another element.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the disclosure will be explained in detail with reference to the accompanying drawings.

Figure 2A:
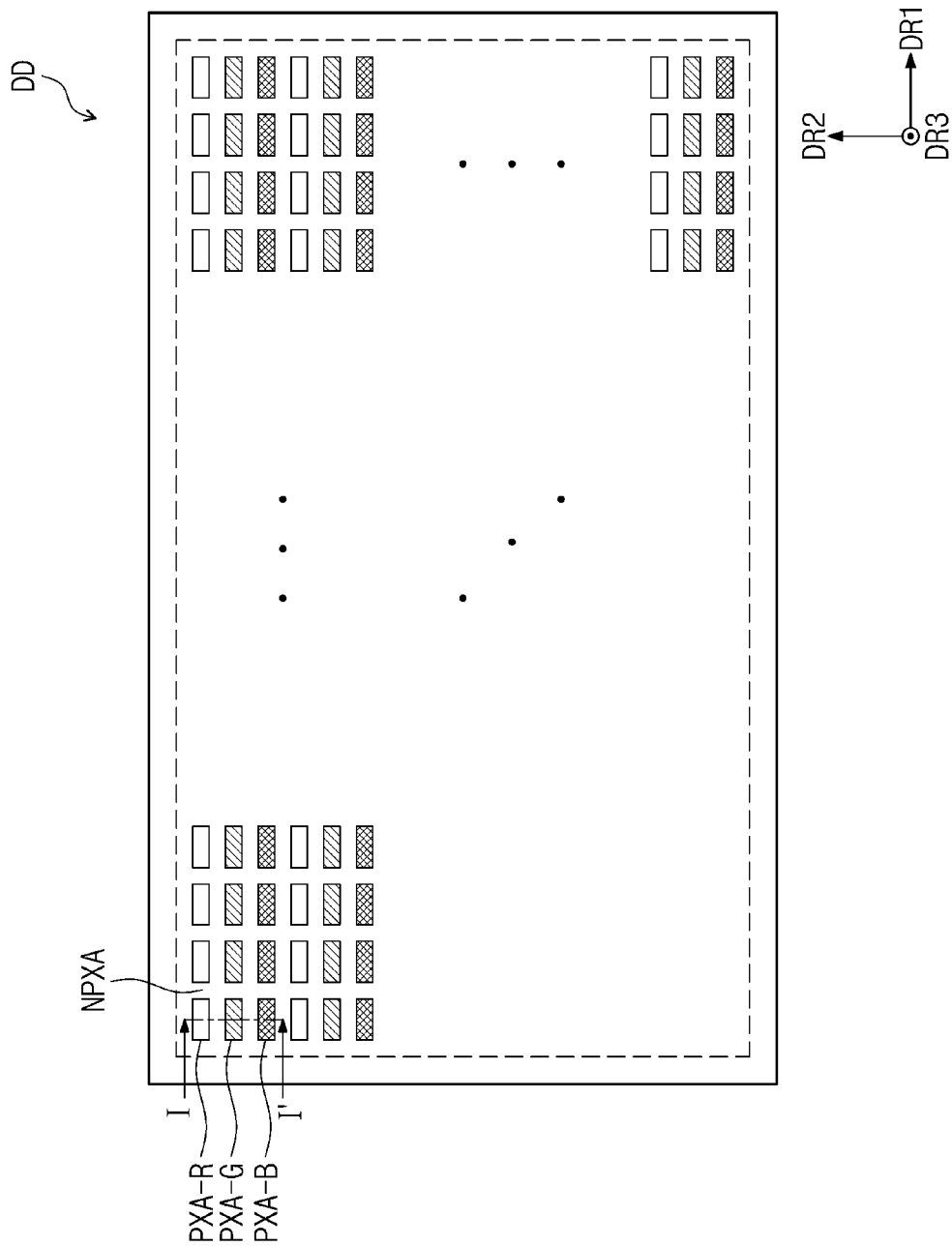
FIG. 2A is a schematic plan view showing a display device according to an embodiment of the disclosure.
Figure 2B:
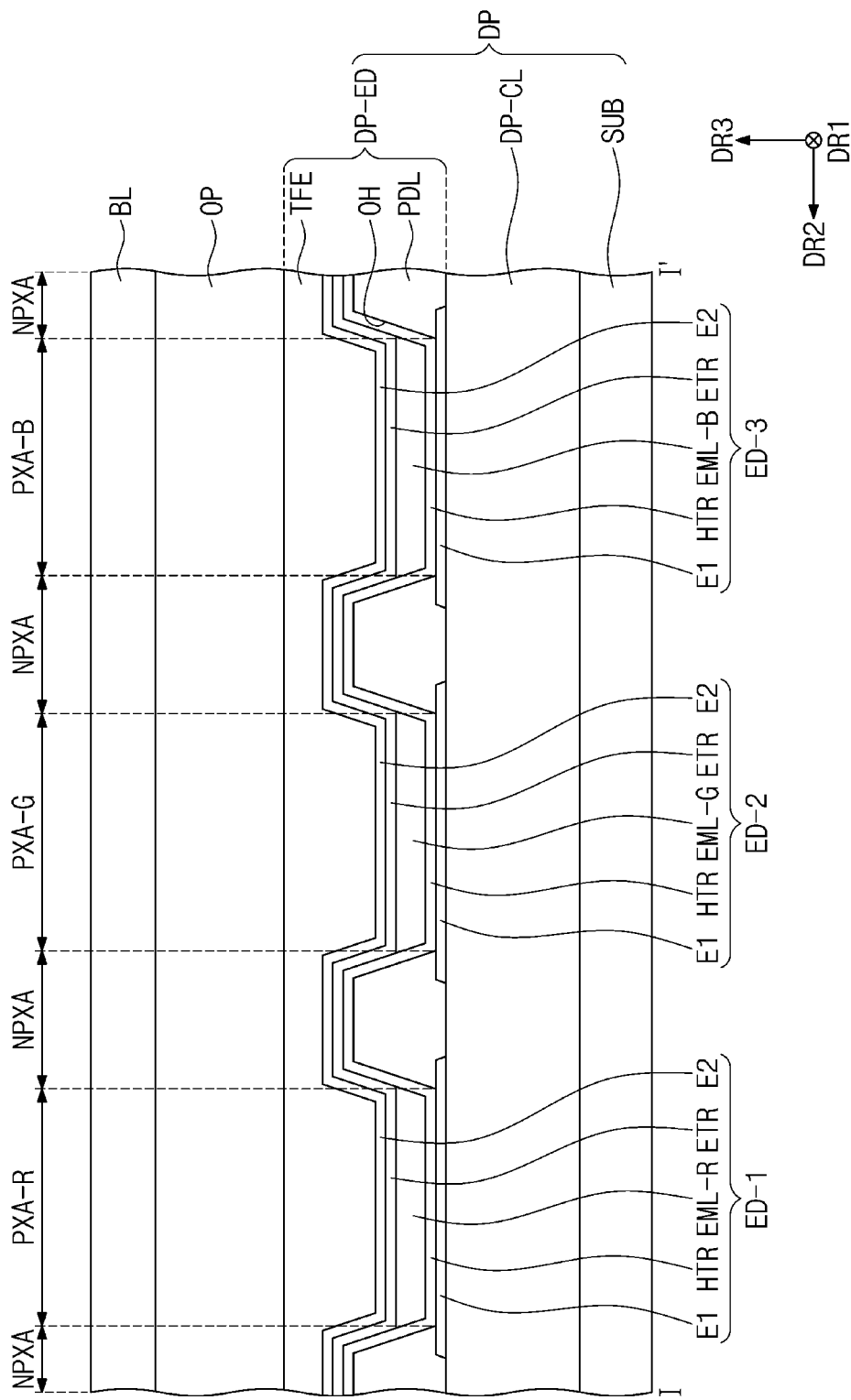
FIG. 2B is a schematic cross-sectional view showing a portion of a display device according to an embodiment of the disclosure.

FIG. 1 is a schematic cross-sectional view showing a deposition apparatus EA according to an embodiment of the disclosure. FIG. 2A is a schematic plan view showing a display device DD according to an embodiment of the disclosure. FIG. 2B is a schematic cross-sectional view showing a portion of the display device DD according to an embodiment of the disclosure. FIG. 2B is a schematic cross-sectional view taken along line I-I' of FIG. 2A.

Referring to FIG. 1, the deposition apparatus EA may include a chamber CH, a deposition source ES, a placing unit HM, a mask MK, a base substrate BS, a pressure unit PM, and a transfer unit DM. The deposition apparatus EA may deposit an organic material or a conductive material on the base substrate BS.

The chamber CH may provide an inner space in which a deposition process is performed. The deposition source ES, the placing unit HM, the mask MK, and the base substrate BS may be disposed in the inner space of the chamber CH.

The deposition source ES may be disposed in the chamber CH and may provide a deposition material to the base substrate BS. As an example, the deposition source ES may evaporate or deposit a deposition material, such as an organic material or a conductive material, to the mask MK. In this case, the deposition material may be deposited on the base substrate BS after passing through the mask MK. In this case, the deposition source ES may heat the deposition material at a high temperature to evaporate or deposit the deposition material.

The placing unit HM may be disposed on a sidewall of the chamber CH to support the mask MK, however, the disclosure is not limited thereto. According to an embodiment, a shape, a position, and number of the placing units HM is not limited thereto as long as the placing units HM may support the mask MK.

The mask MK may extend in a first direction DR1. The mask MK may be provided with deposition holes EH defined or formed therethrough in a third direction DR3. For example, the deposition holes EH may penetrate the mask MK in the third direction DR3. The mask MK may be used to form a functional layer deposited on a front surface of the display device DD which will be described with reference to FIGS. 2A and 2B. The deposition holes EH may be areas corresponding to one or a display device DD individually separated from the base substrate BS. For example, the base substrate BS may be a mother substrate.

The base substrate BS may be disposed in the chamber CH to be adjacent to an upper portion of the chamber CH. The base substrate BS may be the mother substrate that is subject to deposition. The deposition material provided from the deposition source ES may be coated or deposited on the base substrate BS.

The pressure unit PM may include a magnetic plate MP and a support plate YK. The magnetic plate MP may be disposed in the support plate YK, however, the disclosure is not limited thereto. For example, a position, a shape, and the number of the magnetic plates MP are not limited as long as the magnetic plates MP may be disposed on the mask MS and a magnetic force of the magnetic plates MP may combine the mask MS and the base substrate BS.

The magnetic plate MP may generate the magnetic force in a state where the base substrate BS is in close contact with the mask MS to attract the mask MS containing a metal material. Accordingly, a coupling force between the base substrate BS and the mask MS may increase.

The magnetic plate MP may prevent a delamination phenomenon from occurring between the base substrate BS and the mask MS. The delamination phenomenon may be caused by a difference in curvature between the base substrate BS and the mask MS. A shadow phenomenon which is a defective deposition may also be prevented. The magnetic plate MP may be provided as a permanent magnet or an electromagnet.

The support plate YK may accommodate or include the magnetic plate MP. The support plate YK may connect or extend to the transfer unit DM to attach the magnetic plate MP to the base substrate BS or to detach the magnetic plate MP from the base substrate BS.

The transfer unit DM may extend to the pressure unit PM. The transfer unit DM may include a transfer rod ML and a transfer body MC. The transfer body MC may transfer the pressure unit PM in a third direction D3, e.g., up and down directions, using the transfer rod ML. As an example, the transfer body MC may be implemented as a cylinder or a motor, however, the disclosure is not limited thereto. For example, the transfer body MC is not limited as long as the transfer unit DM may transfer the pressure unit PM.

The display device DD shown in FIGS. 2A and 2B may include light emitting areas PXA-R, PXA-G, and PXA-B. The display device DD may include a first light emitting area PXA-R, a second light emitting area PXA-G, and a third light emitting area PXA-B, which may be spaced apart from each other. As an example, the first light emitting area PXA-R may be a red light emitting area emitting a red light, the second light emitting area PXA-G may be a green light emitting area emitting a green light, and the third light emitting area PXA-B may be a blue light emitting area emitting a blue light. The first, second, and third light emitting areas PXA-R, PXA-G, and PXA-B may be spaced apart from each other when viewed in a plan view in the first direction DR1 and not overlapping each other in the second direction DR2. A non-light-emitting area NPXA may be defined or formed between the light emitting areas PXA-R, PXA-G, and PXA-B.

FIG. 2A shows a schematic view of a structure in which the light emitting areas PXA-R, PXA-G, and PXA-B of the display device DD are arranged or disposed in a stripe shape. That is, according to an embodiment, the display device DD may include first light emitting areas PXA-R, second light emitting areas PXA-G, and third light emitting areas PXA-B, each of which is arranged or disposed along the first direction DR1.

The arrangement of the light emitting areas PXA-R, PXA-G, and PXA-B is not limited to the structure shown in FIG. 2A. For example, the light emitting areas PXA-R, PXA-G, and PXA-B may be arranged or disposed in various ways depending on characteristics of display quality required by the display device DD.

Referring to FIG. 2B, the display device DD may include a display panel DP, an optical layer OP disposed on the display panel DP, and a base layer BL. The display panel DP may include light emitting elements ED-1, ED-2, and ED-3. The optical layer OP may be disposed on the display panel DP to control a reflective light of the display panel DP with respect to an external light. The optical layer OP may include, for example, a polarizing layer or a color filter layer. However, the embodiment is not limited thereto. For example, the optical layer OP may be omitted from the display device DD.

The optical layer OP may be disposed on the base layer BL. The base layer BL may provide a base surface on which the optical layer OP may be disposed. The base layer BL may be an inorganic layer, an organic layer, or a composite material layer. According to an embodiment, the base layer BL may be omitted.

According to an embodiment, the display panel DP may include a substrate SUB, a circuit layer DP-CL disposed on the substrate SUB, and a display element layer DP-ED disposed on the circuit layer DP-CL. The display element layer DP-ED may include the light emitting elements ED-1, ED-2, and ED-3. The display panel DP may include an encapsulation layer TFE disposed on the display element layer DP-ED.

According to an embodiment, the display panel DP of the display device DD may be an organic electroluminescence display panel including an organic electroluminescence light emitting element in the display element layer DP-ED. The mask MK may be used to form a portion of the functional layer of the display element layer DP-ED of the organic electroluminescence display panel.

According to an embodiment, the circuit layer DP-CL may be disposed on the substrate SUB, and the circuit layer DP-CL may include transistors (not shown). Each of the transistors (not shown) may include a control electrode, an input electrode, and an output electrode. The circuit layer DP-CL may include insulating layers (not shown).

The encapsulation layer TFE may overlap or cover the light emitting elements ED-1, ED-2, and ED-3. The encapsulation layer TFE may encapsulate the display element layer DP-ED. The encapsulation layer TFE may be a thin film encapsulation layer.

Each of the light emitting elements ED-1, ED-2, and ED-3 may include a first electrode E1, a hole transport area HTR, a corresponding light emitting layer among the light emitting layers EML-R, EML-G, and EML-B, an electron transport area ETR, and a second electrode E2. In FIG. 2B, the light emitting layers EML-R, EML-G, and EML-B of the light emitting elements ED-1, ED-2, and ED-3 may be respectively disposed in openings OH defined or formed through a pixel definition layer PDL, and the hole transport area HTR, the electron transport area ETR, and the second electrode E2 may be disposed on the light emitting elements ED-1, ED-2, and ED-3 as common layers. At least one of the hole transport area HTR, the electron transport area ETR, and the second electrode E2 that are provided in the light emitting elements ED-1, ED-2, and ED-3 of the display device DD as the common layers may be provided using the mask MK according to the disclosure.

A portion of insulating layers included in the circuit layer DP-CL or a portion of the encapsulation layer TFE disposed on the light emitting elements ED-1, ED-2, ED-3 may be provided using the mask MK of the disclosure.

Figure 3:
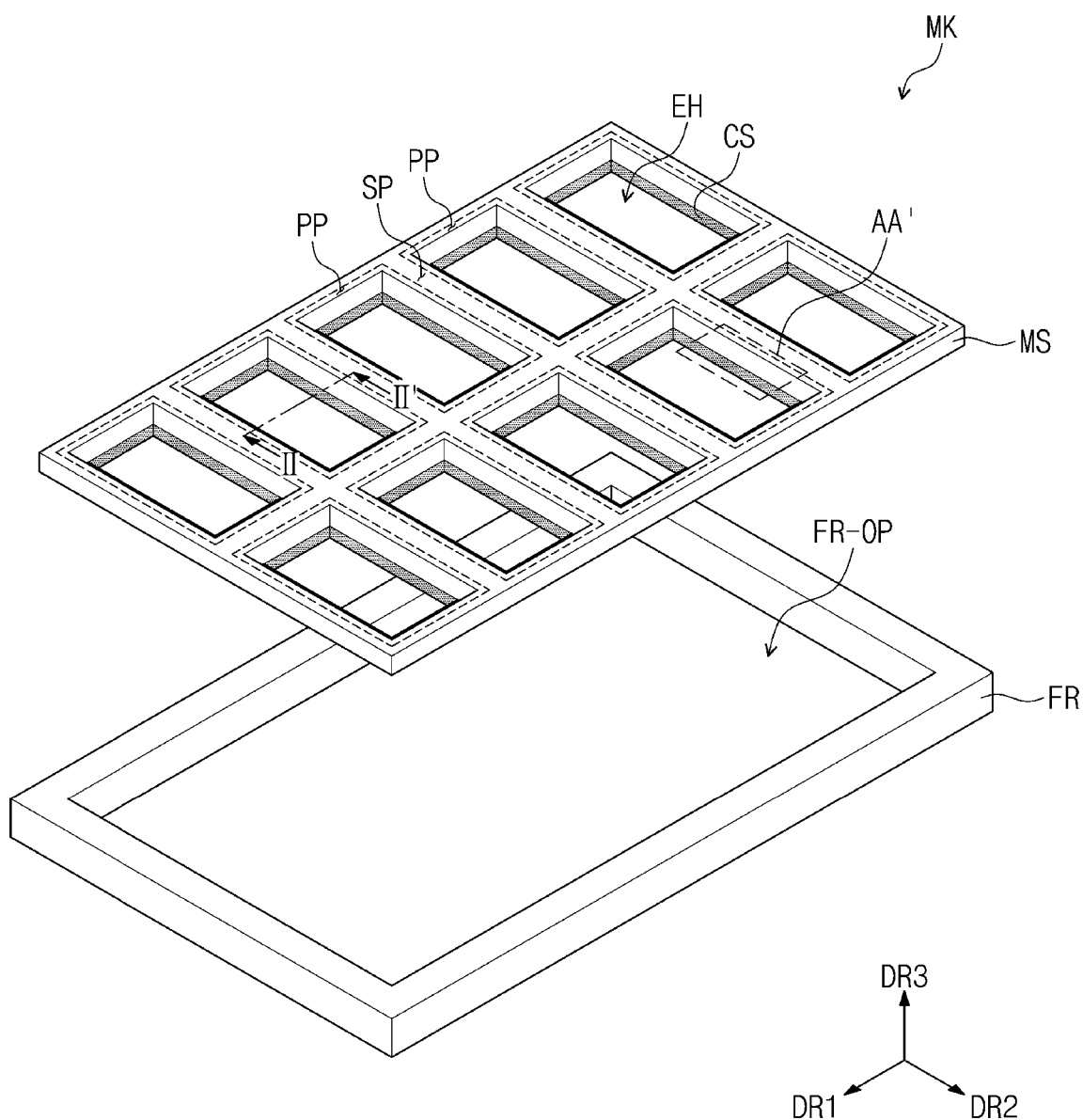
FIG. 3 is an exploded schematic view showing a mask according to an embodiment of the disclosure.
Figure 4A:
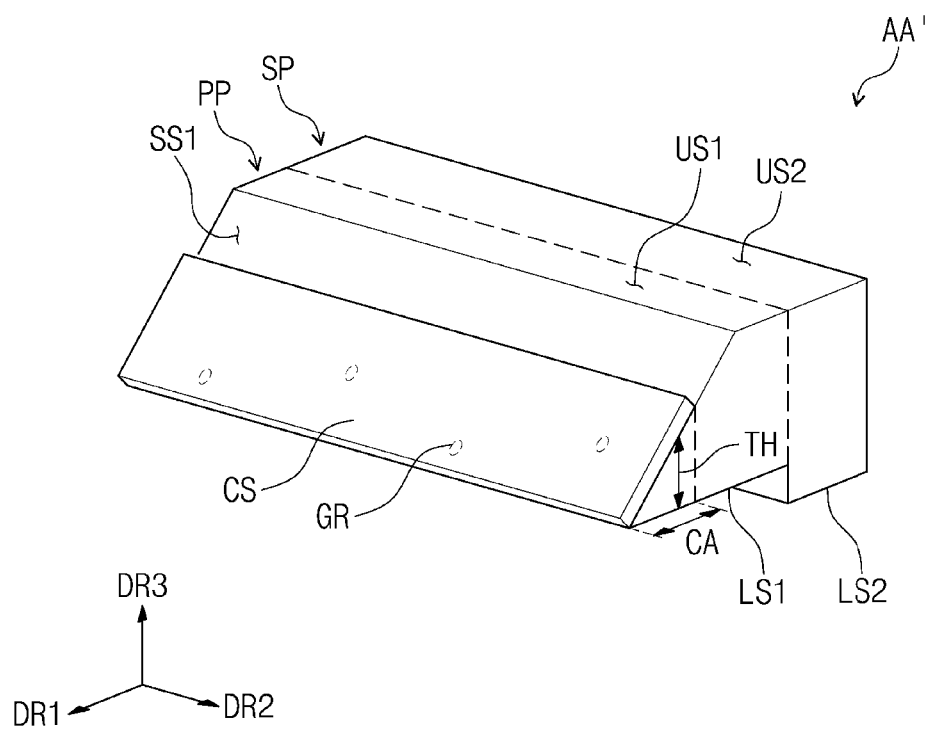
FIG. 4A is an enlarged schematic view showing area AA' of FIG. 3.
Figure 4B:
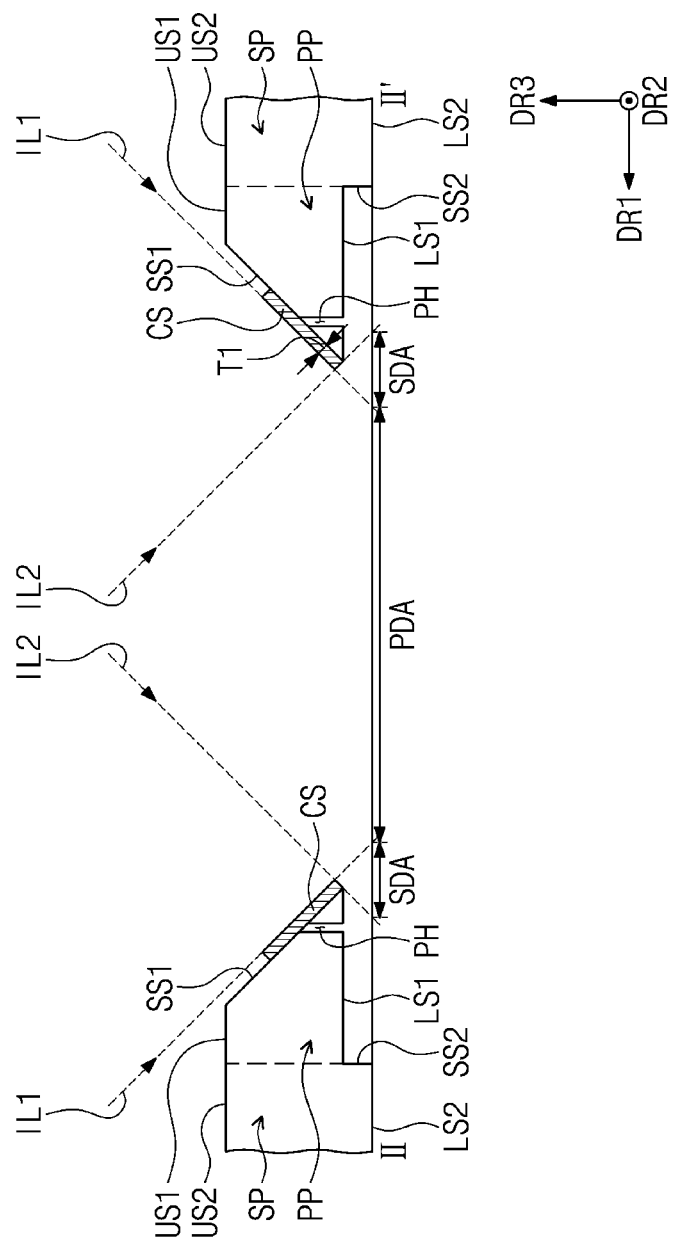
FIG. 4B is a schematic cross-sectional view taken along line II-IF of FIG. 3.
Figure 5A:
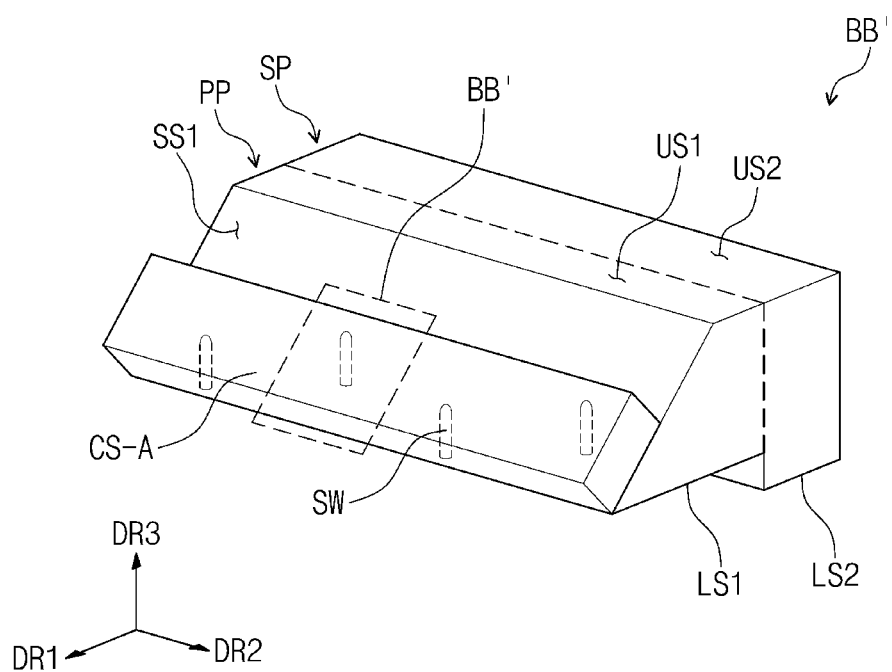
FIG. 5A is a schematic view showing a portion of a mask according to an embodiment of the disclosure.
Figure 5B:
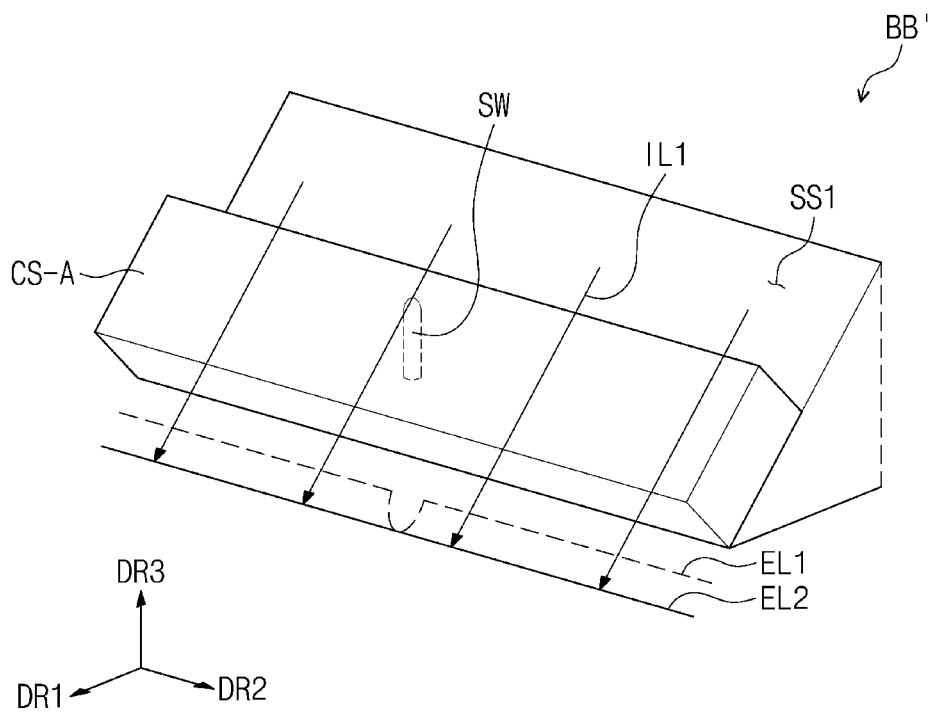
FIG. 5B is an enlarged schematic view showing area BB' of FIG. 5A.

FIG. 3 is an exploded schematic view showing the mask MK according to an embodiment of the disclosure. FIG. 4A is an enlarged schematic view showing area AA' of FIG. 3. FIG. 4B is a schematic cross-sectional view taken along line II-IF of FIG. 3. FIG. 5A is an enlarged schematic view showing area AA' of FIG. 3 according to an embodiment of the disclosure. FIG. 5B is an enlarged schematic view showing area BB' of FIG. 5A. FIG. 4B shows a schematic cross-section of the mask shown in FIG. 4A, and FIG. 5B shows a portion corresponding to a cross-section of the mask shown in FIG. 5A.

Referring to FIG. 3, the mask MK may include a mask frame FR, a mask sheet MS, and a coating layer CS.

The mask frame FR may support the mask sheet MS. As an example, the mask frame FR may be provided with a frame opening FR-OP defined or formed therethrough. For example, the frame opening FR-OP may penetrate the mask frame. The mask sheet MS may be disposed in the frame opening FR-OP, however, the disclosure is not limited thereto. According to an embodiment, the mask frame FR may be disposed at at least one of upper and lower portions of an edge of the mask sheet MS to support the mask sheet MS.

The mask frame FR may be formed of a metal material containing at least one of iron (Fe) and nickel (Ni). As an example, the mask frame FR may include Invar that is an alloy of iron (Fe) and nickel (Ni).

The mask sheet MS may include at least one protruding portion PP and a peripheral portion SP adjacent to or surrounding the protruding portion PP. In the disclosure, the protruding portion PP and the peripheral portion SP are defined by dividing an area of the mask sheet MS for convenience of description, and the protruding portion PP and the peripheral portion SP may substantially form one component.

Multiple protruding portion PP may be provided. Each protruding portion PP may be provided with a deposition hole EH defined or formed therethrough. For example, the deposition hole EH may penetrate the protruding portion PP. Deposition holes EH may be arranged or disposed in the peripheral portion SP to be spaced apart from each other in the first direction DR1 and the second direction DR2. FIG. 3 shows a structure in which ten deposition holes EH are arranged or disposed in two rows by five columns as an example, however, the number of the deposition holes EH is not limited as long as the number of the deposition holes EH are provided in n rows by m columns (each of n and m is a natural number).

FIG. 3 shows each of the deposition holes EH having a quadrangular shape as an example, however, the shape of the deposition holes EH is not limited to the quadrangular shape. According to an embodiment, the deposition holes EH may have a variety of shapes depending on the shape of the common layers deposited and formed on the base substrate BS.

The mask sheet MS may be formed of a metal material containing at least one of iron (Fe) and nickel (Ni). As an example, the mask sheet MS may include Invar that is an alloy of iron (Fe) and nickel (Ni). The mask sheet and the mask frame FR may include a same material. For example, the mask sheet MS may include the same material as the mask frame FR, however, the disclosure is not limited thereto.

The mask sheet MS may have a thermal expansion coefficient equal to or smaller than about 5 ppm/° C. The mask frame FR and the mask sheet MS may have substantially same or similar thermal expansion coefficient. For example, the mask frame FR may have substantially the same or similar thermal expansion coefficient as that of the mask sheet MS. Accordingly, a thermal deformation of the mask sheet MS in the deposition process may be reduced, and thus, the deposition quality with respect to a target substrate may be improved.

According to an embodiment, the coating layer CS may be disposed on the protruding portion PP of the mask sheet MS. Multiple coating layers CS may be provided, and the coating layers CS may be disposed to surround the deposition holes EH, respectively.

Referring to FIGS. 4A and 4B, the protruding portion PP of the mask sheet MS (refer to FIG. 3) may include an upper surface US1, a lower surface LS1 facing the upper surface US1, and a side surface SS1 connecting the upper surface US1 and the lower surface LS1.

The peripheral portion SP of the mask sheet MS may include a first surface US2 and a second surface LS2 facing the first surface US2. The first surface US2 may face the deposition source ES (refer to FIG. 1), and the second surface LS2 may contact (e.g., directly contact) the base substrate BS (refer to FIG. 1).

According to an embodiment, the first surface US2 may extend from the upper surface US1. The first surface US2 and the upper surface US1 may be co-planar. For example, the first surface US2 may have a same plane with the upper surface US1. The second surface LS2 may have a step difference with respect to the lower surface LS1. The step difference may be formed by removing a portion of the lower surface LS1 of the protruding portion PP through a wet etching or laser etching process.

In a case that the lower surface LS1 of the protruding portion PP is formed through the wet etching process, a boundary between a side surface SS2 of the peripheral portion SP and the lower surface LS1 may be provided in a form of a curved line with curvature in cross-section. In a case that the lower surface LS1 is formed through the laser etching process, the boundary between the side surface SS2 of the peripheral portion SP and the lower surface LS1 may be provided in an angled form, however, the disclosure is not limited thereto.

As the lower surface LS1 has the step difference with respect to the second surface LS2, the lower surface LS1 may not contact (e.g., directly contact) the base substrate BS. Accordingly, a deposition area PDA of the base substrate BS may be prevented from being scratched. The deposition area PDA may be an area on the base substrate BS that deposition material may be deposited.

The side surface SS1 of the protruding portion PP may also be formed through the wet etching or laser etching process. In a case that the side surface SS1 is formed through the wet etching, the side surface SS1 may be provided in a concave curved shape toward the lower surface LS1. In a case that the side surface SS1 is formed through the laser etching process, the side surface SS1 may be provided in a plane, however, the disclosure is not limited thereto.

In the disclosure, the deposition hole EH (refer to FIG. 3) defined or formed through or penetrate the mask sheet MS may be defined or formed as a space surrounded by the boundary between the side surface SS1 and the lower surface LS1 of the protruding portion PP.

According to an embodiment, the protruding portion PP may be provided with a groove GR formed by removing at least a portion of the side surface SS1 of the protruding portion PP. For example, the groove GR may be formed in the side surface of the protruding portion PP where impurities are reacted during the wet etching or laser etching process to process the side surface SS1 of the protruding portion PP.

As an example, as shown in FIG. 4B, the protruding portion PP may be provided with a hole PH formed through or penetrating from the side surface SS1 to the lower surface LS1 of the protruding portion PP.

In the case that the groove GR is formed in the protruding portion PP by removing the portion of the side surface SS1 of the protruding portion PP, a portion of the deposition material may seep or dispose into the groove GR during the deposition process and may not be deposited in the deposition area PDA. In the case that the hole PH is formed through or penetrating the protruding portion PP, the deposition material may be deposited on the base substrate BS but in an area other than the deposition area PDA after passing through the hole PH during the deposition process. Accordingly, a cell position accuracy (CPA), which means the precision of the deposition holes EH, may be reduced. Accordingly, in a case where the deposition process is performed using the mask sheet MS including the hole PH, defective display device may be formed due to the defective deposition of the common layer, and the deposition reliability may be reduced.

The mask MK may include the coating layer CS. The coating layer CS may be disposed on the protruding portion PP of the mask sheet MS. In an embodiment, the coating layer CS may be disposed on the side surface SS1 of the protruding portion PP. In this case, the coating layer CS may be disposed on a front portion of the side surface SS1 of the protruding portion PP and may be disposed along the boundary between the side surface SS1 and the lower surface LS1 of the protruding portion PP that defines the deposition hole EH. Accordingly, the coating layer CS may overlap or cover the groove GR.

According to an embodiment, the coating layer CS may be disposed to overlap an area CA (hereinafter, referred to as a coating area) of the side surface SS1 of the protruding portion PP where a thickness TH from the lower surface LS1 to the side surface SS1 is equal to or smaller than about 30 micrometers. For example, the coating layer CS may be disposed to overlap an area of the protruding portion PP where the thickness TH from the lower surface LS1 to the side surface SS1 is equal to or greater than about 5 micrometers and equal to or smaller than about 15 micrometers as the groove GR may generate in the area where the thickness TH of the protruding portion PP from the lower surface LS1 to the side surface SS1 is equal to or greater than about 5 micrometers and equal to or smaller than about 15 micrometers. For example, the groove GR may mainly generate in the area where the thickness TH of the protruding portion PP from the lower surface LS1 to the side surface SS1 is equal to or greater than about 5 micrometers and equal to or smaller than about 15 micrometers.

Referring to FIG. 4B, in a case that the deposition material is discharged from the deposition source ES, the deposition material may be deposited on the base substrate BS after passing through the deposition hole EH of the mask sheet MS. In FIG. 4B, the base substrate BS is shown as a solid line extending from the second surface LS2 of the peripheral portion SP.

According to the embodiment, in a case that the coating layer CS is disposed on the side surface SS1 of the protruding portion PP, a predetermined deposition area may be reduced due to the thickness of the coating layer CS in a case that the deposition material passes through the deposition hole EH. Accordingly, in a case that the thickness of the coating layer CS on the side surface SS1 of the protruding portion PP decreases, the cell position accuracy (CPA) may be improved.

Referring to FIG. 4B, a line extending along a top surface of the coating layer CS that faces the one surface of the protrusion PP in contact with the coating layer CS (e.g., the side surface SS1 of the protruding portion PP) may be defined or formed as a first incident line ILL and a line extending in a direction orthogonal to the first incident line IL1 from an end surface of the top surface of the coating layer CS that adjacent to the boundary between the side surface SS1 and the lower surface LS1 of the protruding portion PP may be defined or formed as a second incident line IL2.

The base substrate BS may include a shadow area SDA. The shadow area SDA may be an area on the base substrate BS where the deposition material may not pass through due to interference of one end of the protruding portion PP adjacent to the proposition hole EH and the coating layer CS. The deposition area PDA may be an area on the base substrate BS where the deposition material passes and deposits. According to the embodiment, the shadow area SDA and the deposition area PDA may be defined or formed depending on the thickness of the coating layer CS.

As an example, as the thickness of the coating layer CS increases, a width of the shadow area SDA defined by the first incident line IS1 and the second incident line IL2 crossing or intersecting the first incident line IS1 may increase. Accordingly, a width of the deposition area PDA may decrease, and the cell position accuracy (CPA) may be reduced.

Referring to FIG. 4B, in an embodiment, a thickness T1 of the coating layer CS may be equal to or smaller than about 5 micrometers. In this case, as the thickness of the coating layer CS decreases, the width of the deposition area PDA may increase, and error or deviation between a predetermined deposition area and the deposition area PDA where the deposition material is deposited may be minimized.

FIGS. 4A and 4B show a structure in which an end surface of the coating layer CS adjacent to the deposition hole EH is disposed to be aligned with the boundary between the side surface SS1 and the lower surface LS1 of the protruding portion PP, however, the structure is not limited thereto. As an example, the end surface of the coating layer CS may be disposed on the side surface SS1 to be spaced apart from the boundary between the side surface SS1 and the lower surface LS1 of the protruding portion PP.

According to an embodiment, the coating layer CS may have a thermal expansion coefficient equal to or smaller than about 3 ppm/° C. Since the deposition process may be performed in the chamber CH (refer to FIG. 1) with high temperature, a material having a low thermal expansion rate may be used. Accordingly, deformation of the coating layer CS may be reduced in the deposition process even though high heat is applied to the coating layer CS. Thus, a change of the first incident line IL1 during the deposition process may be reduced, and the deposition reliability may be further improved.

According to an embodiment, the coating layer CS may include polyimide (PI). In a case that the coating layer CS includes the polyimide (PI), an out-gassing phenomenon in a vacuum state may be reduced. Since the deposition process may be performed in the chamber CH in a vacuum state, the deterioration of the deposition reliability caused by the out-gassing phenomenon may be prevented.

The coating layer CS including the polyimide (PI) may have a chemical resistance to a material that is used to clean the deposition material attached to the mask MK after the deposition process. As an example, the cleaning material may include an organic solvent, such as N-Methyl-2-pyrrolidone (NMP), Ethyl alcohol (EtOH), or the like. Since the polyimide (PI) has a low reactivity with respect to the organic solvent, damage of the coating layer CS (e.g., peeled off) even after several cleaning processes may be reduced or prevented.

The coating layer CS including the polyimide (PI) may have a low strain rate in a case that a tensile force is applied thereto. Accordingly, even though the mask sheet MS may be stretched in the process of attaching the mask sheet MS to the mask frame FR, the coating layer CS disposed on the protruding portion PP of the mask sheet MS may not be damaged.

Accordingly, even though the coating layer CS goes through the manufacturing process of the mask MK and the deposition process in which the mask MK is used, damage or deformation of the coating layer CS may be prevented, and thus, errors or derivations of the deposition area PDA due to the coating layer CS may be reduced. According to an embodiment, the difference in thickness between the peripheral portion SP and the protruding portion PP is equal to or smaller than about 30 micrometers.

According to the disclosure, as the coating layer CS that covers the groove GR may be formed during the manufacturing process of mask MK, the deposition defect may be prevented. For example, the deposition material may be prevented from seeping or disposed into the groove GR and from not being deposited in the predetermined deposition area, and the deposition material may be prevented from being formed in an area other than the predetermined deposition area after passing through the hole PH. Accordingly, the deposition precision and the deposition reliability of the deposition apparatus EA (refer to FIG. 1) using the mask MK may be improved.

Figure 5C:
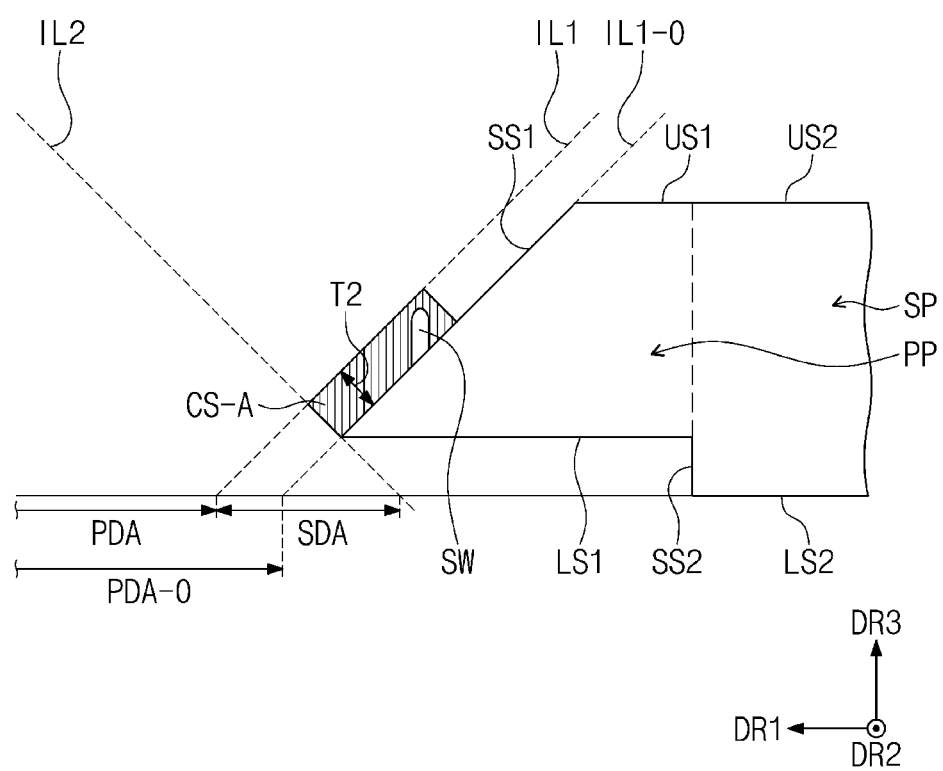
FIG. 5C is a schematic cross-sectional view showing a portion of a mask according to an embodiment of present disclosure.

FIG. 5A is a schematic view of a portion of a mask according to an embodiment of the disclosure. FIG. 5B is an enlarged schematic view of area BB' of FIG. 5A. FIG. 5C is a schematic cross-sectional view of a portion of a mask according to an embodiment of the disclosure. FIG. 5C shows a schematic cross-section of the mask shown in FIG. 5A.

Referring to FIGS. 5A to 5C, a protruding portion PP may include at least one protrusion SW protruded from a side surface SS1 of the protruding portion PP. The at least one protrusion SW may be formed in the process of forming the side surface SS1 of the protruding portion PP.

For example, in a case where aluminum and other metal impurities with a low laser absorption rate are present in a mask sheet MS that a laser etching process is performed to form the side surface SS1 of the protruding portion PP, the impurities may act as a mask in the laser etching process. For example, the protrusion SW may be a portion of the side surface SS1 of the protruding portion PP that remains (e.g., not being etched) due to the impurities.

The protrusion SW formed on the protruding portion PP may prevent a deposition material from passing along the side surface SS1 of the protruding portion PP. For example, the deposition material may not be deposited in the deposition area PDA.

In FIG. 5B, a first deposition line EL1 (shown by a dotted line) may be defined or formed in a case that the protrusion SW is formed on the side surface SS1 of the protruding portion PP. The first deposition line EL1 may be defined or formed as a boundary between a deposition area PDA and a shadow area SDA.

As shown in FIG. 5B, as the deposition material may not be deposited due to the protrusion SW, the deposition area PDA may decrease and the shadow area SDA may increase. Accordingly, the first deposition line EL1 may be formed with errors or deviations. For example, the first deposition line EL1 may be deviated from a predetermined deposition line. Accordingly, the protrusion SW of the protruding portion PP may reduce the cell position accuracy (CPA) and may cause a deterioration in the deposition precision and the deposition reliability.

The mask MK (refer to FIGS. 1 and 3) may include a coating layer CS-A. In the embodiment, the coating layer CS-A may be disposed on the side surface SS1 of the protruding portion PP. In this case, the coating layer CS-A may be disposed along the boundary between the side surface SS1 and the lower surface LS1 of the protruding portion PP that defines the deposition hole EH. Accordingly, the coating layer CS-A may overlap or cover the protrusion SW.

Referring to FIGS. 5B and 5C, a second deposition line EL2 may be formed after the coating layer CS-A is disposed. The second deposition line EL2 may be defined by a first incident line IL1 extending along a top surface of the coating layer CS-A. As the coating layer CS-A is disposed along the boundary between the side surface SS1 and the lower surface LS1 of the protruding portion PP, an entire top surface of the coating layer CS-A defining the first incident line IL1 may be substantially flat. Accordingly, the first incident line IL1 may not be influenced by the protrusion SW. For example, the first incident line IL1 may not be deviated (e.g., without a protruded region corresponding to the protrusion SW as shown in FIG. 5B). Accordingly, errors or deviations in the deposition line may be reduced, and each of the deposition area PDA and the shadow area SDA may be formed to have a uniform size. Thus, the coating layer CS-A may improve the deposition precision and the deposition reliability.

According to an embodiment, the coating layer CS-A may have a thickness T2 equal to or smaller than about 20 micrometers as the protrusion SW may have a height equal to or smaller than about 20 micrometers. For example, the thickness of the coating layer CS-A may depend on the height of the protrusion SW such that the thickness of the coating layer CS-A may cover the protrusion SW.

Referring to FIG. 5C, the first incident line IL1 may be referred to as a repair line and may be formed after the coating layer CS-A is disposed on the side surface SS1 of the protruding portion PP. A reference line IL1-0 may be defined or formed by the side surface SS1 of the protruding portion PP. The first incident line IL1 may be formed farther from the protruding portion PP than the reference line IL1-0 in the first direction DR1. For example, the deposition area PDA, after the coating layer CS-A is disposed, may have a size smaller than that of a deposition area PDA-0 in a case that the coating layer CS-A is not disposed. Accordingly, according to an embodiment, as the coating layer CS-A having the thickness corresponding to the height of the protrusion SW is disposed to cover the protrusion SW protruded from the side surface SS1, the size of the deposition area PDA may be reduced. Accordingly, a size of the deposition hole EH may be set or determined in consideration of the reduced size of the deposition area PDA.

As an example, in a case that the coating layer CS-A is disposed, the thickness T2 of the coating layer CS-A may be about 20 micrometers, the deposition area PDA may have a width that is smaller by about 20 micrometers than that of the deposition area PDA-0 when the coating layer CS-A is not disposed. According to an embodiment, the size of the deposition hole EH may be set or determined to define or form the deposition area. Accordingly, the width of the deposition hole EH may be greater by about 20 micrometers than the width of the common layer to be deposited, and thus, the deposition precision may be further improved.

FIGS. 5A and 5B show an end of the coating layer CS-A adjacent to the deposition hole EH is aligned with a boundary between the side surface SS1 and a lower surface LS1 of the protruding portion PP as an example, however, the disclosure is not limited thereto. As an example, the end of the coating layer CS-A may be disposed on the side surface SS1 to be spaced apart from the boundary between the side surface SS1 and the lower surface LS1 of the protruding portion PP.

According to an embodiment, materials for the coating layer CS-A may be the same or similar as those described with reference to FIGS. 4A and 4B. As an example, the coating layer CS-A may include polyimide (PI) and may be prevented from being deformed or damaged even though the coating layer CS-A goes through the manufacturing process of the mask MK and the deposition process in which the mask MK is used. Accordingly, the errors or deviations of the deposition area PDA caused by the coating layer CS-A may be reduced.

According to the disclosure, as the coating layer CS-A may be disposed to cover the protrusion SW formed in the manufacturing process of the mask MK, the deposition defect caused by the defects generated in the manufacturing process of the mask MK may be prevented. Accordingly, the deposition precision and the deposition reliability of the deposition apparatus EA (refer to FIG. 1) using the mask MK may be improved.

Figure 6:
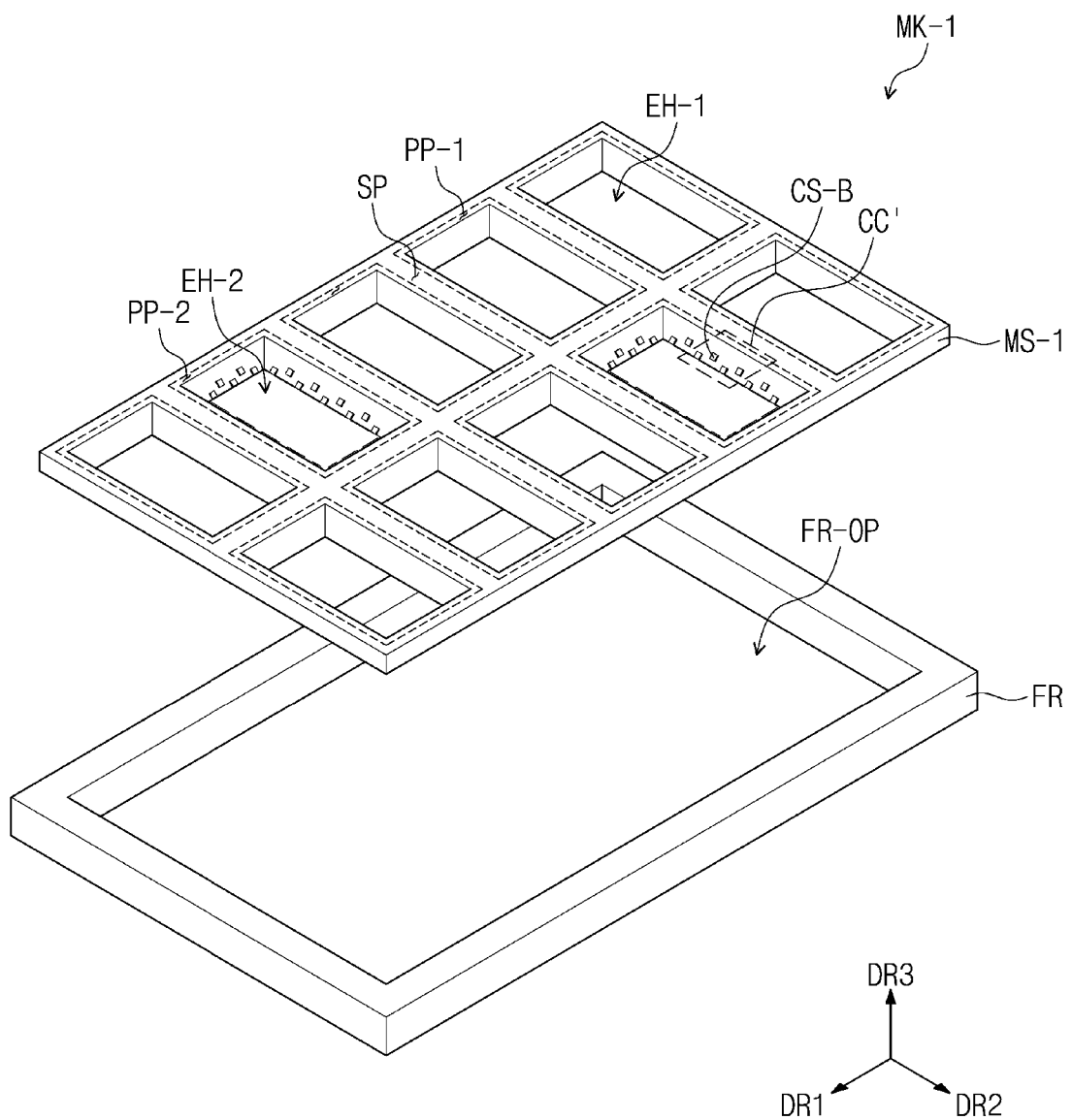
FIG. 6 is an exploded schematic view showing a mask according to an embodiment of the disclosure.
Figure 7:
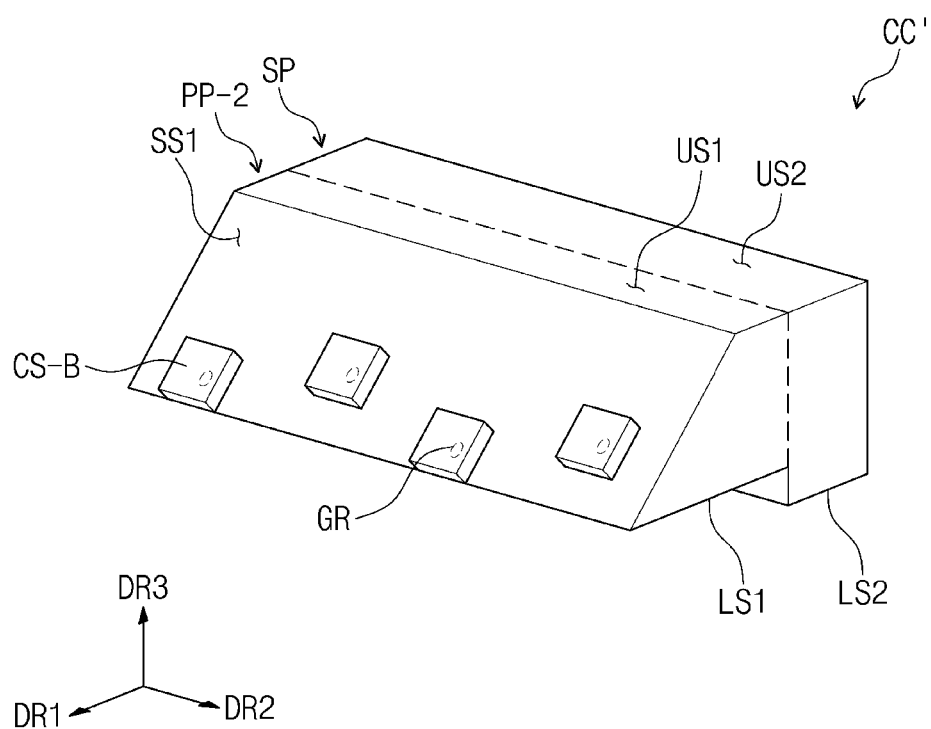
FIG. 7 is an enlarged schematic view showing area CC' of FIG. 6.

FIG. 6 is an exploded schematic view showing a mask MK-1 according to an embodiment of the disclosure. FIG. 7 is an enlarged schematic view showing area CC' of FIG. 6. In FIGS. 6 and 7, the same or similar reference numerals denote the same or similar elements in FIGS. 1A to 5C, and thus, detailed descriptions of the same or similar elements will be omitted.

Referring to FIGS. 6 and 7, a mask sheet MS-1 may include a first protruding portion PP-1 through which a first deposition hole EH-1 is defined or formed, a second protruding portion PP-2 through which a second deposition hole EH-2 is defined or formed, and a peripheral portion SP adjacent to or surrounding the first protruding portion PP-1 and the second protruding portion PP-2. The first deposition hole EH-1 and the second deposition hole EH-2 may be defined or formed to be space apart from each other. In the disclosure, the first protruding portion PP-1, the second protruding portion PP-2, and the peripheral portion SP may be defined or formed by dividing an area of the mask sheet MS-1 for convenience of description, and the first protruding portion PP-1, the second protruding portion PP-2, and the peripheral portion SP may substantially form one component.

According to an embodiment, a coating layer CS-B may be disposed on the second protruding portion PP-2. Multiple coating layers CS-B may be provided or disposed on a second protruding portion PP-2, and the coating layers CS-B may be disposed to be spaced apart from each other.

Referring to FIG. 7, the second protruding portion PP-2 may be provided with a groove GR defined or formed by removing at least a portion of a side surface of the second protruding portion PP-2. As an example, as shown in FIG. 4B, the protruding portion PP may be provided with the hole PH defined or formed through or penetrating from the side surface SS1 to the lower surface LS1 of the protruding portion PP.

FIGS. 6 and 7 show grooves GR formed in the second protruding portion PP-2 as an example. According to an embodiment, coating layers CS-B may be provided or disposed to correspond to the grooves GR, respectively. For example, the grooves GR may be randomly formed in the side surface SS1 of the second protruding portion PP-2, and the coating layers CS-B may be disposed to correspond to the grooves GR that are randomly formed.

According to an embodiment, the coating layer CS-B may have a thickness equal to or smaller than about 5 micrometers. Although not shown in FIG. 7, a first incident line, a reference line, a deposition area, and a shadow area may be defined or formed to be the same or similar as those shown in FIG. 4B where the coating layer CS is disposed. Accordingly, as the thickness of the coating layer CS-B decreases, a width of the deposition area PDA described with reference to FIG. 4B may increase, and an error or deviation between a predetermined deposition area and the deposition area PDA where the deposition material is deposited may be minimized. Detailed description of the same or similar as that described with reference to FIG. 4B will be omitted.

FIG. 7 shows the coating layers CS-B having substantially same or similar areas as each other in a plan view as an example, however, the disclosure is not limited thereto. According to an embodiment, area of each of the coating layers CS-B may be changed depending on a size of a corresponding groove GR. For example, the area of the coating layers CS-B is not limited as long as the area of each of the coating layers CS-B may be greater than that of the corresponding groove GR to cover the corresponding groove GR.

As shown in FIG. 7, each of the coating layers CS-B may have a quadrangular shape when viewed in a plane as an example, however, the shape of the coating layers CS-B is not limited thereto. As an example, the shape of each of the coating layers CS-B is not limited thereto as long as each of the coating layers CS-B may cover the corresponding groove GR.

According to an embodiment, the coating layer CS-B may overlap or cover the groove GR formed in the manufacturing process of the mask MK-1, and deposition defect in the mask MK-1 may be prevented, and thus, the deposition precision and the deposition reliability may be improved.

According to the mask sheet MS-1 shown in FIGS. 6 and 7, the coating layer CS-B may be disposed only on the second protruding portion PP-2 where at least one groove GR is formed, and the coating layer CS-B may not be disposed on the first protruding portion PP-1 where the groove GR is not formed. For example, a position of the groove GR may be identified after a defect inspection of the manufactured mask MK-1 is performed, and the coating layer CS-B may be disposed only in area where the groove GR is formed. Accordingly, in a case where a relatively small number of the grooves GR is formed, the mask MK-1 that may not cause deposition defect may be manufactured using a minimum amount of material for the coating layer.

On the other hand, different from the mask sheet MS-1 shown in FIGS. 6 and 7, in the case of the mask sheet MS shown in FIGS. 3 to 4B, the coating layer CS (refer to FIGS. 3 to 4B) is disposed on all the protruding portions PP (refer to FIGS. 3 to 4B) in the manufacturing process of the mask MK. Accordingly, although a defect inspection is not performed, the mask MK that may not cause deposition defect may be manufactured by covering the groove GR formed in the protruding portion PP.

Figure 8A:
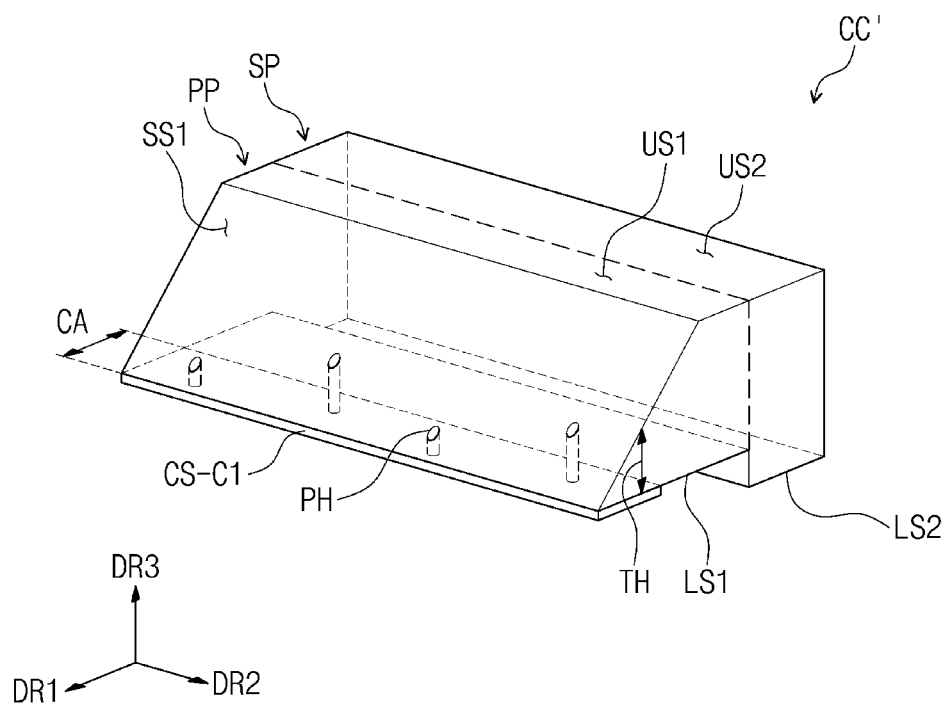
FIG. 8A is a schematic view showing a mask according to an embodiment of the disclosure.
Figure 8B:
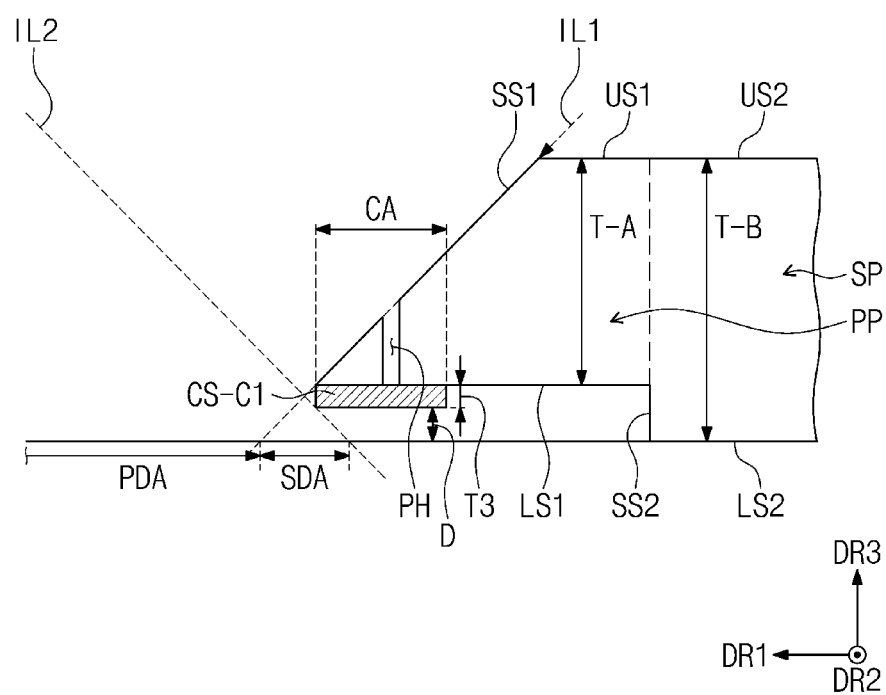
FIG. 8B is a schematic cross-sectional view showing a mask according to an embodiment of the disclosure.
Figure 9:
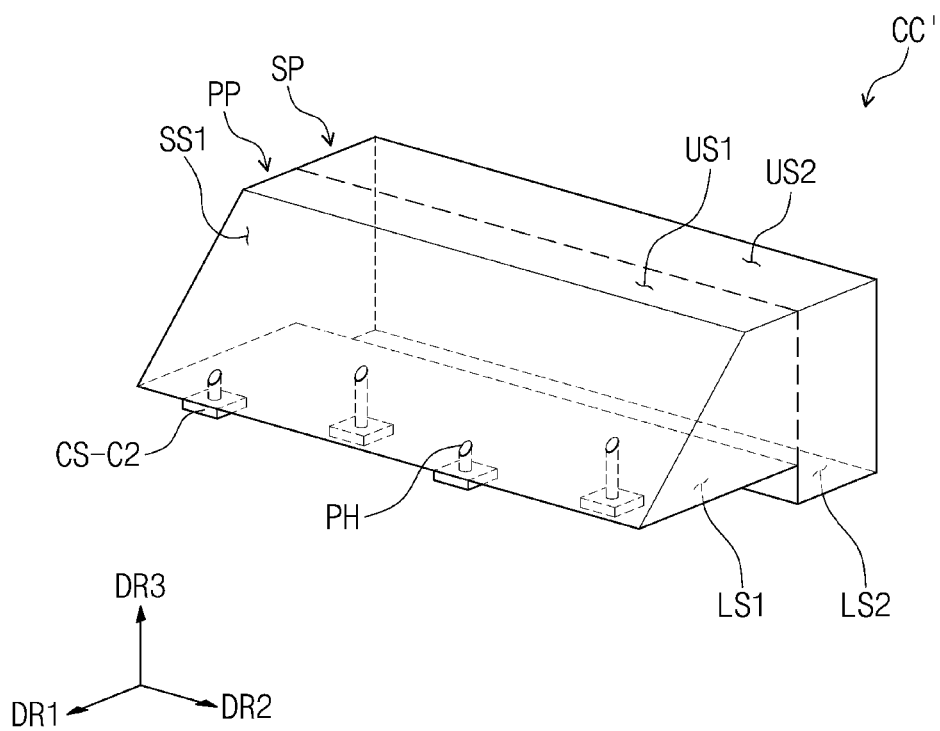
FIG. 9 is a schematic view showing a mask according to an embodiment of the disclosure.

FIG. 8A is a schematic view showing a mask according to an embodiment of the disclosure. FIG. 8B is a schematic cross-sectional view showing a mask according to an embodiment of the disclosure. FIG. 9 is a schematic view of a mask according to an embodiment of the disclosure. According to an embodiment, a protrusion PP may be provided or disposed with at least one hole PH defined or formed from a side surface SS1 to a lower surface LS1 of the protrusion PP, and coating layers CS-C1 and CS-C2 may be disposed on the lower surface LS1 to overlap or cover the hole PH. In FIGS. 8A, 8B, and 9, same or similar reference numerals denote same or similar elements in FIGS. 1A to 7, and thus, detailed descriptions of the same or similar elements will be omitted.

Referring to FIG. 8A, the coating layer CS-C1 may be disposed on a front portion of the lower surface LS1 of the protruding portion PP. As an example, in a case that a mask sheet MS (refer to FIG. 3) includes protruding portions PP, coating layers CS-C1 may be provided or disposed on the lower surfaces LS1 of the protruding portions PP, respectively. Accordingly, since the coating layers CS-C1 may be disposed on the lower surfaces LS1 of the protruding portions PP to cover the hole PH, the mask MK (refer to FIG. 3) in which deposition defect may not occurred may be manufactured even though a defect inspection is not performed.

According to an embodiment, the coating layer CS-C1 may be disposed to overlap a coating area CA in which a thickness TH from the lower surface LS1 to the side surface SS1 of the protruding portion PP is equal to or smaller than about 30 micrometers in the lower surface LS1 of the protruding portion PP. For example, the coating layer CS-C1 may be disposed to overlap an area in which the thickness TH from the lower surface LS1 to the side surface SS1 of the protruding portion PP is equal to or greater than about 5 micrometers and equal to or smaller than about 15 micrometers as the hole PH may formed in the area where the thickness TH from the lower surface LS1 to the side surface SS1 of the protruding portion PP is equal to or greater than about 5 micrometers and equal to or smaller than about 15 micrometers.

According to an embodiment, the coating layer CS-C1 may be disposed such that an end of the coating layer CS-C1 adjacent to the deposition hole EH (refer to FIG. 3) is aligned with a boundary between the side surface SS1 and the lower surface LS1 of the protruding portion PP. In this case, referring to FIG. 8B, a second incident line IL2 may be defined or formed by the end of the coating layer CS-C1. The second incident line IL2 may be influenced (or moved) by a thickness T3 of the coating layer CS-C1.

For example, the second incident line IL2 may be more spaced apart from the protruding portion PP in a case that the coating layer CS-C1 is disposed on the lower surface LS1 than in a case that the coating layer CS-C1 is not disposed. Accordingly, when the coating layer CS-C1 is disposed on the lower surface LS1, a shadow area SDA may be reduced. In this case, as the thickness of the coating layer CS-C1 increases, the effect of reducing the shadow area SDA may increase. Accordingly, a width of a dead space may be reduced, and a size of an inactive area of the display device DD (refer to FIGS. 2A and 2B) may be reduced.

However, referring to FIG. 8B, a thickness T3 of the coating layer CS-C1 may be about 5 micrometers smaller than a difference between a thickness T-B from a first surface US2 to a second surface LS2 of a peripheral portion SP and a thickness T-A from an upper surface US1 to the lower surface LS1 of the protruding portion PP. A distance D between the coating layer CS-C1 and the base substrate BS (refer to FIG. 1) may be equal to or greater than about 5 micrometers. In a case that the distance D between the coating layer CS-C1 and the base substrate BS is smaller than about 5 micrometers, a scratch may occur in the base substrate BS due to a compressed mask MK, and defects may occur in the display device DD (refer to FIGS. 2A and 2B).

According to an embodiment, the lower surface LS1 of the protruding portion PP may be formed through a wet etching process, and the distance D between the coating layer CS-C1 and the base substrate BS may be equal to or smaller than about 30 micrometers. According to an embodiment, the lower surface LS1 of the protruding portion PP may be formed through a laser etching process, and the distance D between the coating layer CS-C1 and the base substrate BS may be equal to or smaller than about 10 micrometers.

Referring to FIG. 9, coating layers CS-C2 may be provided or disposed to correspond to holes PH. For example, the hole PH may be overlapped or covered by the coating layer CS-C2. The coating layer CS-C2 may disposed in the area where the hole PH is formed after the defect inspection is performed on the manufactured mask MK (refer to FIG. 1). For example, the coating layer CS-C2 may disposed only in the area where the hole PH is formed. Accordingly, the mask MK that may not cause deposition defect may be manufactured and an amount of material used for the coating layer CS-C2 may be reduced.

FIG. 9 shows the coating layers CS-C2 have same or similar areas in a plan view as an example. According to an embodiment, area of each of the coating layers CS-C2 may be set or determined differently depending on a size of a corresponding hole PH. For example, the area of each of the coating layers CS-C2 is not limited as long as area of the coating layers CS-C2 may be greater than that of the corresponding hole PH to cover the hole PH.

FIG. 9 shows a structure where each of the coating layers CS-C2 has a quadrangular shape in a plan view as an example, however, the disclosure is not limited thereto. As an example, the shape of the coating layers CS-C2 is not limited as long as each of the coating layers CS-C2 may cover the corresponding hole.

According to an embodiment, as the coating layers CS-C1 and CS-C2 that cover the hole PH formed in the manufacturing process of the mask MK are disposed on the lower surface LS1, the occurrence of the deposition defect caused in the manufacturing process of the mask MK may be prevented. Accordingly, the deposition precision and the deposition reliability of the deposition apparatus EA (refer to FIG. 1) using the mask MK may be improved.

Although the embodiments of the disclosure have been described, it is understood that the disclosure should not be limited to these embodiments but various changes and modifications can be made by one ordinary skilled in the art within the spirit and scope of the disclosure as hereinafter claimed.

Therefore, the disclosed subject matter should not be limited to any single embodiment described herein, and the scope of the present inventive concept shall be determined according to the attached claims.

What is claimed is:

1. A mask comprising:
a protruding portion provided with a deposition hole formed therethrough, the protruding portion comprising:
an upper surface,
a lower surface facing the upper surface,
a side surface disposed between the upper surface and the lower surface and inclined at an angle with respect to the lower surface, and
at least one of a protrusion protruded from the side surface of the protruding portion and a groove formed by removing at least a portion of the protruding portion from the side surface protruding portion; and
a peripheral portion, the peripheral portion comprising:
a first surface extending from the upper surface of the protruding portion, and
a second surface facing the first surface and having a step difference with respect to the lower surface of the protruding portion; and
a coating layer disposed on the protruding portion, the coating layer covering at least one of the protrusion and the groove.

2. The mask of claim 1, wherein the coating layer is disposed in an area where a thickness between the lower surface and the side surface of the protruding portion is equal to or smaller than about 30 micrometers in case that the protruding portion comprises the groove.

3. The mask of claim 2, wherein the coating layer is disposed on the side surface of the protruding portion and has a thickness equal to or smaller than about 5 micrometers.

4. The mask of claim 2, wherein
the groove penetrates the protruding portion from the side surface of the protruding portion to the lower surface of the protruding portion, and
the coating layer is disposed on the lower surface of the protruding portion.

5. The mask of claim 4, wherein
a thickness between the first surface and the second surface of the peripheral portion is greater than a thickness between the upper surface and the lower surface of the protruding portion, and
the coating layer has a thickness about 5 micrometers smaller than a difference in thickness between the peripheral portion and the protruding portion.

6. The mask of claim 5, wherein the difference in thickness between the peripheral portion and the protruding portion is equal to or smaller than about 30 micrometers.

7. The mask of claim 1, wherein the coating layer is disposed on the side surface of the protruding portion in case that the protruding portion comprises the protrusion.

8. The mask of claim 7, wherein the coating layer has a thickness equal to or smaller than about 20 micrometers.

9. The mask of claim 1, wherein the coating layer has a thermal expansion coefficient equal to or smaller than about 3 ppm/° C.

10. The mask of claim 1, wherein the coating layer comprises polyimide.

11. The mask of claim 1, wherein the protruding portion and the peripheral portion comprise at least an alloy of iron (Fe) and nickel (Ni).

12. The mask of claim 1, wherein
the groove is provided in plural such that the mask includes a plurality of grooves,
the coating layer is provided in plural such that the mask includes a plurality of coating layers, and
the plurality of coating layers correspond to the plurality of grooves, respectively, and are disposed spaced apart from each other.

13. The mask of claim 1, wherein the coating layer surrounds at least a portion of the side surface of the protruding portion or at least a portion of the lower surface of the protruding portion.

14. A deposition apparatus comprising:
a chamber accommodating a base substrate;
a deposition source spraying a deposition material to the base substrate; and
a mask comprising:
a first protruding portion including a first deposition hole,
a second protruding portion including a second deposition hole spaced apart from the first deposition hole,
a peripheral portion surrounding the first protruding portion and the second protruding portion, the peripheral portion comprising:
a first surface facing the deposition source, and
a second surface facing the first surface and contacting the base substrate, and
a coating layer, wherein
each of the first protruding portion and the second protruding portion comprises:
a lower surface,
an upper surface extending from the first surface of the peripheral portion, and
a side surface disposed between the upper surface and the lower surface and inclined at an angle with respect to the lower surface,
the second protruding portion comprises:
a protrusion protruded from the side surface of the second protruding portion, and
a groove formed by removing at least a portion of the second protruding portion; and
the coating layer covers at least one of the protrusion and the groove.

15. The deposition apparatus of claim 14, wherein the coating layer has a thermal expansion coefficient equal to or smaller than about 3 ppm/° C.

16. The deposition apparatus of claim 14, wherein the coating layer is disposed in an area where a thickness between the lower surface and the side surface is equal to or smaller than about 30 micrometers in case that the second protruding portion comprises the groove.

17. The deposition apparatus of claim 14, wherein the coating layer is disposed on the side surface of the second protruding portion and has a thickness equal to or smaller than about 5 micrometers.

18. The deposition apparatus of claim 14, wherein
the groove penetrates the second protruding portion from the side surface of the second protruding portion to the lower surface of the second protruding portion, and
the coating layer is disposed on the lower surface of the second protruding portion and spaced apart from the base substrate by about 5 micrometers or more.

19. The deposition apparatus of claim 18, wherein an end surface of the coating layer adjacent to the second deposition hole is aligned with a boundary between the side surface of the second protruding portion and the lower surface of the second protruding portion.

20. The deposition apparatus of claim 14, wherein the coating layer is disposed on the side surface of the second protruding portion and has a thickness equal to or smaller than about 20 micrometers in case that the second protruding portion comprises the protrusion.

* * * * *